US012578371B2

(12) United States Patent
Simpson et al.

(10) Patent No.: US 12,578,371 B2
(45) Date of Patent: Mar. 17, 2026

(54) REMOTE CALCULATION OF EARTH CONNECTION IMPEDANCE

(71) Applicant: Viper Innovations Limited, Portishead (GB)

(72) Inventors: Steve Simpson, Bristol (GB); Keith David Coventry, Bristol (GB)

(73) Assignee: Viper Innovations Limited (GB)

( * ) Notice: Subject to any disclaimer, the term of this patent is extended or adjusted under 35 U.S.C. 154(b) by 167 days.

(21) Appl. No.: 18/570,296

(22) PCT Filed: May 19, 2022

(86) PCT No.: PCT/GB2022/051263
§ 371 (c)(1),
(2) Date: Dec. 14, 2023

(87) PCT Pub. No.: WO2022/263789
PCT Pub. Date: Dec. 22, 2022

(65) Prior Publication Data
US 2024/0264212 A1 Aug. 8, 2024

(30) Foreign Application Priority Data

Jun. 18, 2021 (GB) ..................................... 2108725

(51) Int. Cl.
*G01R 27/16* (2006.01)
*G01R 31/52* (2020.01)
*H02H 3/16* (2006.01)

(52) U.S. Cl.
CPC ............. *G01R 27/16* (2013.01); *G01R 31/52* (2020.01); *H02H 3/162* (2013.01)

(58) Field of Classification Search
CPC ........ G01R 27/16; G01R 31/52; G01R 27/20; H02H 3/162; H02H 3/16; H02H 5/10
(Continued)

(56) References Cited

U.S. PATENT DOCUMENTS

| | | | | |
|---|---|---|---|---|
| 10,690,709 | B2 * | 6/2020 | Kim | ..................... G01R 19/165 |
| 11,353,486 | B2 * | 6/2022 | Schaefer | .............. G01R 27/025 |

(Continued)

FOREIGN PATENT DOCUMENTS

| | | |
|---|---|---|
| DE | 102017217473 B3 | 1/2019 |
| EP | 1001270 A2 | 5/2000 |
| GB | 2469706 A | 10/2010 |

OTHER PUBLICATIONS

International Search Report and Written Opinion issued in corresponding PCT/GB2022/051263, dated Aug. 10, 2022, 13 pages.

*Primary Examiner* — Giovanni Astacio-Oquendo
(74) *Attorney, Agent, or Firm* — Morgan, Lewis & Bockius LLP

(57) ABSTRACT

A method of remotely determining an impedance of an earth connection (142) of a first electrical equipment (122) connected to a power supply network (300). The method comprises receiving (606), from a first measurement node (302) connected to the first electrical equipment, a first value of an insulation impedance of the power supply network and receiving (612), from a second measurement node (304) connected to the power supply network, a second value of an insulation impedance of the power supply network. The method further comprises calculating (614) the impedance of the earth connection of the first electrical equipment using the first value of the insulation impedance of the power supply network, the second value of the insulation impedance of the power supply network and a known impedance value of an earth connection (144) of the second measurement node.

20 Claims, 6 Drawing Sheets

(58) Field of Classification Search
USPC ........................................ 324/512, 509, 500
See application file for complete search history.

(56) References Cited

U.S. PATENT DOCUMENTS

| | | | |
|---|---|---|---|
| 2015/0349512 A1* | 12/2015 | Li | ............................ H02H 5/04 |
| | | | 361/47 |
| 2017/0110869 A1 | 4/2017 | Bargues | |
| 2023/0400489 A1* | 12/2023 | Qian | ...................... G01R 31/52 |
| 2025/0237685 A1* | 7/2025 | Brown | ................... G01R 27/18 |

\* cited by examiner

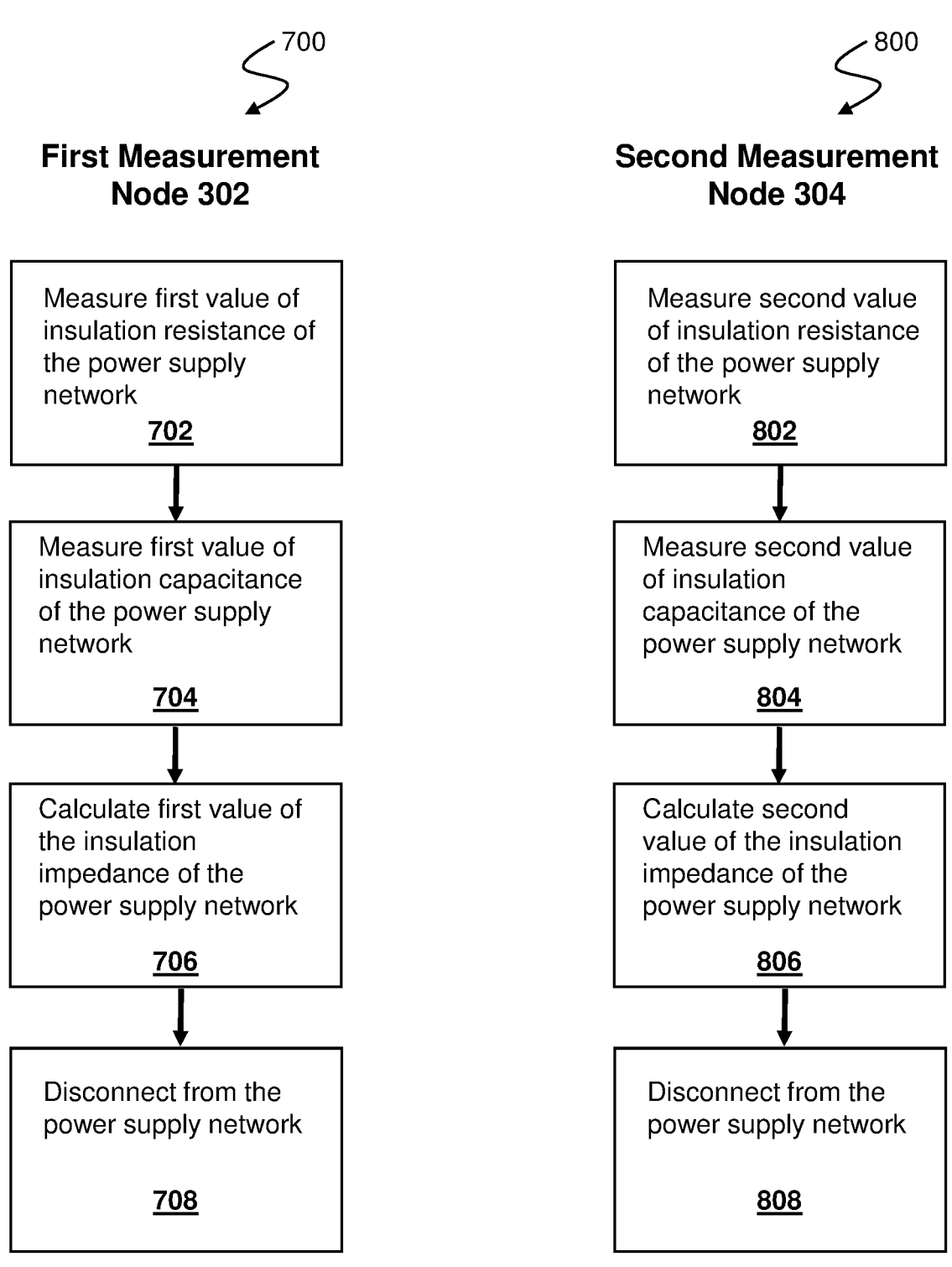

First Measurement Node 302

Measure first value of insulation resistance of the power supply network

702

Measure first value of insulation capacitance of the power supply network

704

Calculate first value of the insulation impedance of the power supply network

706

Disconnect from the power supply network

Second Measurement Node 304

Measure second value of insulation resistance of the power supply network

802

Measure second value of insulation capacitance of the power supply network

804

Calculate second value of the insulation impedance of the power supply network

806

Disconnect from the power supply network

REMOTE CALCULATION OF EARTH CONNECTION IMPEDANCE

CROSS-REFERENCE TO RELATED APPLICATIONS

This application is a 371 National Stage entry of International Patent Application No. PCT/GB2022/051263 filed May 19, 2022, that claims the benefit of the GB Patent Application No. 2108725.9 filed Jun. 18, 2021 entitled "Remote Calculation of Earth Connection Impedance", each of which is incorporated by reference herein in its entirety.

The present disclosure relates to monitoring an impedance of an earth connection. In particular, the disclosure relates to remotely determining an impedance of an earth connection of an electrical equipment connected to a power supply network.

Power supply networks are commonly used to provide an electrical power supply to a plurality of electrical equipment. To ensure safety of the power supply network, each electrical equipment usually comprises an earth connection. Over time, the earth connection can degrade and its impedance can increase accordingly. If the impedance of the earth connection of the electrical equipment increases above a certain threshold, the earth connection may no longer provide protection against electric shocks, should a fault develop within the electrical equipment. Therefore, it is often necessary to periodically monitor the impedance of the earth connections of electrical equipment within a power supply network.

One example of a power supply network is a rail signalling power supply network. The rail signalling power supply network usually comprises multiple signalling apparatus housings (SAHs) located at various distributed locations along a trackside. Rail personnel are generally required to walk the track to conduct traditional manual testing of an earth connection of each SAH. This method is often time consuming and exposes the rail personnel to trackside safety risks inherent in a railway environment.

The Applicant's earlier patent, GB2552143B, describes a test arrangement operable to monitor the status of an elongate electrical cable. For example, the test arrangement may be operable to monitor the electrical continuity or resistance of the cable. However, there is currently no way of remotely determining an impedance of an earth connection of an electrical equipment within a power supply network.

SUMMARY

The present disclosure provides methods, an apparatus and a system for remotely determining an impedance of an earth connection of an electrical equipment within a power supply network.

According to a first aspect of the invention, there is provided a method of remotely determining an impedance of an earth connection of a first electrical equipment connected to a power supply network. The method comprises: receiving, from a first measurement node connected to the first electrical equipment, a first value of an insulation impedance of the power supply network; receiving, from a second measurement node connected to the power supply network, a second value of an insulation impedance of the power supply network; and calculating the impedance of the earth connection of the first electrical equipment using the first value of the insulation impedance of the power supply network, the second value of the insulation impedance of the power supply network and a known impedance value of an earth connection of the second measurement node.

In this manner, the impedance of the earth connection of the first electrical equipment may be determined remotely. This removes the need for conducting traditional manual and intrusive tests, which are often time-consuming and may pose safety risks to the personnel conducting the tests. In some embodiments, the first electrical equipment may be difficult or dangerous to access. As such, due to the location and distribution of some electrical equipment within a given power supply network, a method which allows for remote determination of their respective earth connection impedance values is highly advantageous.

The power supply network may comprise a signalling power supply (SPS) network. Signalling power supply networks are used in railways to supply remote signalling equipment with electrical power. The method in accordance with the present disclosure is particularly useful in railway applications, because it allows rail personnel to monitor the impedance of the earth connection of trackside electrical equipment without having to walk the track to conduct traditional manual testing. This reduces the exposure of personnel to trackside safety risks inherent in a railway environment.

The first electrical equipment may comprise any type of electrical load. For example, the first electrical equipment may comprise an inductive load, a resistive load and/or a capacitive load. In some embodiments, the first electrical equipment may comprise a functional supply point. The functional supply point may take the form of a transformer. The transformer may be operable to step down the supply voltage for use in controlling signalling lights, track points, points heaters, level crossings or similar. Additionally or alternatively, the first electrical equipment may comprise switchgear equipment, communications networking equipment and/or monitoring equipment. It is to be appreciated that the above examples of the first electrical equipment are not an exhaustive list.

The first measurement node and/or the second measurement node may comprise any monitoring apparatus capable of measuring an insulation resistance and an insulation capacitance of the power supply network.

The first value of an insulation impedance of the power supply network and the second value of an insulation impedance of the power supply network may be received via a wired network (e.g., a wired electrical network, which may be a dedicated communication network or may involve the use of power-line communication on a conductor of the power supply network itself). Additionally or alternatively, the first value of an insulation impedance of the power supply network and the second value of an insulation impedance of the power supply network may be received via an optical fibre based communications network and/or a wireless communications network.

The known impedance value of the earth connection of the second measurement node may be obtained through manual measurement. For example, the impedance of the earth connection of the second measurement node may be measured using an impedance analyser or an LCR meter. Alternatively, the known impedance value of the earth connection of the second measurement node may be provided by an installer of the second measurement node. By manually measuring the impedance of the earth connection of the second measurement node, the user ensures that the known impedance value of the earth connection of the second measurement node is accurate. This in turn improves the accuracy of the calculated impedance of the earth connection of the first electrical equipment.

The second measurement node may be in a location that is safely and easily accessible. Thus, the impedance of the earth connection of the second measurement node can be measured safely and easily. Further, the impedance of the earth connection of the second measurement node is assumed to be relatively constant over time. Therefore, impedance of the earth connection of the second measurement node does not need to be manually measured every time the earth connection of the first measurement node is calculated.

The first electrical equipment may be within a first housing. The earth connection of the first electrical equipment may comprise an earth connection of the first housing.

The first electrical equipment may be encased within the first housing. The first housing may be constructed out of a conductive material. The first housing may be constructed out of steel, aluminium and/or iron. The first housing may comprise a first signalling apparatus housing (SAH). The first signalling apparatus housing may take a form of a first rail location case. The earth connection of the first housing may comprise an earth rod, an earth mat and/or a connection to an earthed structure. The earthed structure may comprise, for example, an earthed overhead line equipment.

The first measurement node may be connected in series with the earth connection of the first housing. An earth connection of the first measurement node may comprise the earth connection of the first housing. In this arrangement, the first measurement node is able to detect the effect that the impedance of the earth connection of the first housing has on the first value of the insulation impedance of the power supply network.

The second measurement node may be connected to a second electrical equipment. The second electrical equipment may be connected to the power supply network.

The second electrical equipment may comprise any type of electrical load. For example, the second electrical equipment may comprise an inductive load, a resistive load and/or a capacitive load. In some embodiments, the second electrical equipment may comprise a functional supply point. The functional supply point may take the form of a transformer. The transformer may be operable to step down the supply voltage for use in controlling signalling lights, track points, points heaters, level crossings or similar. Additionally or alternatively, the second electrical equipment may comprise switchgear equipment, communications networking equipment and/or monitoring equipment. It is to be appreciated that the above examples of the second electrical equipment are not an exhaustive list.

The first electrical equipment may be spaced apart from the second electrical equipment. For example, the first electrical equipment and the second electrical equipment may be distributed along the power supply network.

The second electrical equipment may be within a second housing. An earth connection of the second electrical equipment may comprise an earth connection of the second housing.

The second electrical equipment may be encased within the second housing. The second housing may be constructed out of a conductive material. The second housing may be constructed out of steel, aluminium and/or iron. The second housing may comprise a second signalling apparatus housing (SAH). The second signalling apparatus housing may take a form of a second rail location case. The earth connection of the second housing may comprise an earth rod, an earth mat and/or a connection to an earthed structure. The earthed structure may comprise, for example, an earthed overhead line equipment.

The second measurement node may be connected in series with the earth connection of the second housing. The earth connection of the second measurement node may comprise the earth connection of the second housing. In this arrangement, the second measurement node is able to detect the effect that the impedance of the earth connection of the second housing has on the second value of the insulation impedance of the power supply network.

The first measurement node may determine the first value of the insulation impedance of the power supply network by: determining a resistive component of the first value of the insulation impedance of the power supply network; determining a reactive component of the first value of the insulation impedance of the power supply network; and calculating the first value of the insulation impedance of the power supply network using the resistive component and the reactive component of the first value of the insulation impedance of the power supply network.

Determining the resistive component of the first value of the insulation impedance of the power supply network may comprise measuring a first value of insulation resistance of the power supply network. Determining the reactive component of the first value of the insulation impedance of the power supply network may comprise measuring a first value of insulation capacitance of the power supply network. In some embodiments, determining the reactive component of the first value of the insulation impedance of the power supply network may further comprise measuring a first value of insulation inductance of the power supply network.

After determining the first value of the insulation impedance of the power supply network, the first measurement node may disconnect from the power supply network. For example, after measuring the first value of insulation resistance of the power supply network and the first value of insulation capacitance of the power supply network, the first measurement node may disconnect from the power supply network. One or more relays within the first measurement node may be switchable to disconnect the first measurement node from the power supply network. The first measurement node may be configured to automatically disconnect from the power supply network after determining the first value of the insulation impedance of the power supply network. In this manner, current is prevented from flowing through the first measurement node when no measurement is being taken. By allowing the first measurement node to disconnect from the power supply network in this manner, the impedance of the earth connection of the first measurement node does not affect any measurements which are subsequently taken by the second measurement node.

The second measurement node may determine the second value of the insulation impedance of the power supply network by: determining a resistive component of the second value of the insulation impedance of the power supply network; determining a reactive component of the second value of the insulation impedance of the power supply network; and calculating the second value of the insulation impedance of the power supply network using the resistive component and the reactive component of the second value of the insulation impedance of the power supply network.

Determining the resistive component of the second value of the insulation impedance of the power supply network may comprise measuring a second value of insulation resistance of the power supply network. Determining the reactive component of the second value of the insulation impedance of the power supply network may comprise measuring a second value of insulation capacitance of the power supply network. In some embodiments, determining the reactive component of the second value of the insulation impedance of the power supply network may further comprise measuring a second value of insulation inductance of the power supply network.

After determining the second value of the insulation impedance of the power supply network, the second measurement node may disconnect from the power supply network. For example, after measuring the second value of insulation resistance of the power supply network and the second value of insulation capacitance of the power supply network, the second measurement node may disconnect from the power supply network. One or more relays within the second measurement node may be switchable to disconnect the second measurement node from the power supply network. The second measurement node may be configured to automatically disconnect from the power supply network after determining the second value of the insulation impedance of the power supply network. In this manner, current is prevented from flowing through the second measurement node when no measurement is being taken. By allowing the second measurement node to disconnect from the power supply network in this manner, the impedance of the earth connection of the second measurement node does not affect any measurements which are subsequently taken by the first measurement node.

The method may further comprise evaluating the integrity of the earth connection of the first electrical equipment, using the calculated impedance of the earth connection of the first electrical equipment. In this manner, the calculated impedance of the earth connection of the first electrical equipment may be used to remotely determine whether a fault has developed in the earth connection of the first electrical equipment. Improperly earthed electrical equipment poses an electric shock hazard, therefore the method in accordance with the present disclosure acts to improve the safety of the power supply network.

Evaluating the integrity of the earth connection of the first electrical equipment may comprise: calculating a maximum tolerable impedance of the earth connection of the first electrical equipment; and comparing the calculated impedance of the earth connection of the first electrical equipment with the maximum tolerable impedance of the earth connection of the first electrical equipment. The maximum tolerable impedance of the earth connection of the first electrical equipment may comprise an impedance threshold above which the earth connection of the first electrical equipment no longer affords protection against an electric shock, should an electric fault develop within the first electrical equipment. In one example, the maximum tolerable impedance of the earth connection of the first electrical equipment may be 10Ω.

Evaluating the integrity of the earth connection of the first electrical equipment may further comprise detecting a fault in the earth connection of the first electrical equipment by determining that the calculated impedance value of the earth connection of the first electrical equipment exceeds the maximum tolerable impedance of the earth connection of the first electrical equipment.

The method may further comprise generating a safety warning upon detecting the fault. Generating the safety warning may comprise activating an alert system. The alert system may comprise a visual, auditory, and/or a haptic output. In one example, the alert system may comprise a warning light. In another example, the alert system may comprise an auditory alarm. The alert system may be proximal to the first electrical equipment. By positioning the alert system in such a manner, users near to the first electrical equipment are warned of any faults in the earth connection of the first electrical equipment. The users can subsequently mitigate any associated safety risks. In this way, the safety of the power supply network is improved.

Additionally or alternatively, generating the safety warning may comprise: generating a warning message; and transmitting the warning message to a user device. The user device may comprise a smartphone, a tablet computer, a laptop computer, a desktop computer, a smart television, or a wearable device (e.g., a smartwatch). The warning message may alert a user of the user device that the fault has developed in the earth connection of the first electrical equipment. Transmitting such a warning message can provide an early warning system for the user. For example, a user may be alerted of any safety risks prior to interacting with the first electrical equipment.

The method may further comprise repeating the method of remotely determining the impedance value of the earth connection of the first electrical equipment after a predetermined amount of time. The method may further comprise monitoring changes to the impedance value of the earth connection of the first electrical equipment over the predetermined amount of time. The predetermined amount of time may be any amount of time set by the user. For example, the predetermined amount of time may be an hour, a day, a week or a month. Alternatively, the method may be performed continuously. Monitoring the changes to the impedance value of the earth connection of the first electrical equipment over time may be used to predict potential failures of the earth connection of the first electrical equipment before they occur. This in turn can prevent unexpected disruptions to the power supply network caused by the need to repair earth connection faults. Monitoring the changes to the impedance value of the earth connection of the first electrical equipment over time may also be useful in determining the average lifespan of an earth connection in a given environment. This information may be subsequently used to efficiently maintain the power supply network.

The method may further comprise: receiving, from a third measurement node connected to a third electrical equipment, a third value of an insulation impedance of the power supply network, wherein the third electrical equipment may be connected to the power supply network. The method may further comprise calculating an impedance of the earth connection of the third electrical equipment using the third value of the insulation impedance of the power supply network, the second value of the insulation impedance of the power supply network and the known impedance value of the earth connection of the second measurement node. The impedance of the earth connection of the third electrical equipment may be determined in the same manner as the impedance of the earth connection of the first electrical equipment. A plurality of electrical equipment may be connected to the power supply network. The method in accordance with the present disclosure may be used to determine an impedance of the earth connection of each electrical equipment connected to the power supply network. As such, the method in accordance with the present disclosure is especially beneficial for use in power supply networks comprising a large number of connected electrical equipment. In such large networks, attempting to manually assess the earth connection of each one of the electrical equipment may be impractical and inefficient.

A further aspect provides an apparatus configured to perform any of the methods disclosed herein. For example, the apparatus may comprise one or more processors in communication with a memory. The memory may comprise instructions which, when executed by the one or more processors, cause the apparatus to perform any of the methods disclosed herein.

A further aspect provides a computer-readable medium comprising instructions which, when executed by a computer, cause the computer to perform any of the methods disclosed herein.

A further aspect provides a system comprising: a control unit configured to perform any of the methods disclosed herein and a power supply network comprising at least a first electrical equipment, a first measurement node and a second measurement node. The control unit may comprise a cloud-based analytics engine.

BRIEF DESCRIPTION OF THE FIGURES

Embodiments will now be described, purely by way of example, with reference to the accompanying drawings, in which:

FIG. 7 is a flow diagram of a method of determining a first value of the insulation impedance of the power supply network by a first measurement node;

FIG. 8 is a flow diagram of a method of determining a second value of the insulation impedance of the power supply network by a second measurement node.

DETAILED DESCRIPTION

Figure 1:
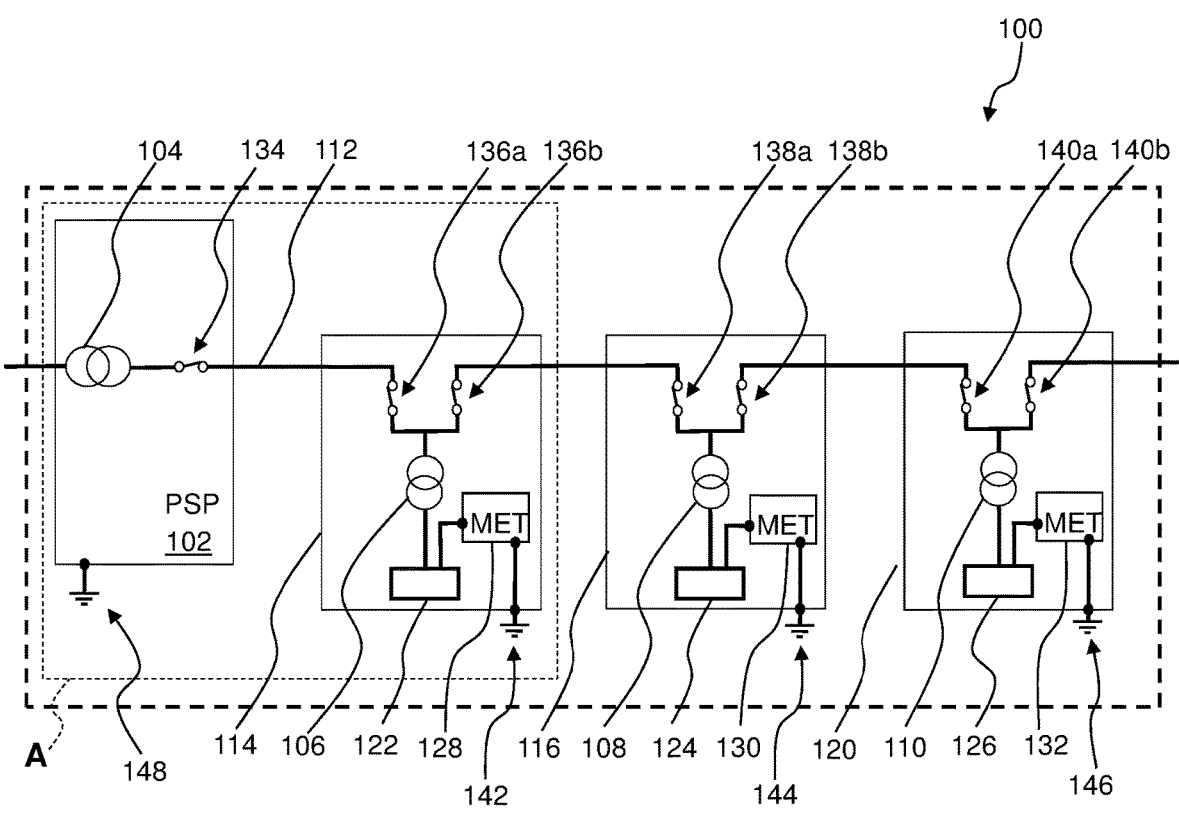
FIG. 1 shows a schematic representation of a part of a power supply network for a railway signalling system.

FIG. 1 shows a schematic representation of a part of a typical power supply network 100 for a railway signalling system. The power supply network 100 comprises a track-side principal supply point (PSP) 102 operable to supply electrical power and control signals via an elongated cable 112 to electrical equipment arranged within a first signalling apparatus housing (SAH) 114, a second SAH 116 and a third SAH 120. The elongated cable 112 may be an electrically isolated unearthed cable. The first SAH 114, the second SAH 116 and the third SAH 120 may take the form of rail location cases. Each SAH may be constructed out of a conductive material. For example, each SAH may be constructed out of steel.

Although only three SAHs 114, 116, 120 are shown in the example power supply network 100 for the sake of simplicity, the present disclosure is applicable to power supply networks comprising more, or fewer, than three SAHs.

Further, the SAHs 114, 116, 120 are shown as being arranged in series with the PSP 102. However, many other SAH arrangements within the power supply network 100 are possible, and the method of the present disclosure is equally applicable to electrical equipment within these arrangements. For example, the SAHs may be arranged in a radial, ring or dual-end-fed feeder configurations.

The PSP 102 houses a step-up transformer 104 and a first switch 134. The PSP 102 is also earthed using a fourth earth connection 148. The step-up transformer 104 is operable to convert an incoming electrical supply voltage into a distribution voltage. In some railway systems, the incoming electrical supply voltage is in the region of 400V and the distribution voltage is in the region of 650V. The first switch 134 is shown in a closed position. However, if a fault occurs within electrical equipment connected to the PSP 102, the first switch 134 may be opened to cut off the electrical equipment from the incoming electrical power supply.

Housed within the first SAH 114, there is provided a second switch 136a, a third switch 136b, a first step-down transformer 106, a first electrical load 122 and a first main earth terminal (MET) 128. The first step-down transformer connects the first electrical load 122 to the PSP 102 via the second switch 136a and the third switch 136b. The first electrical load 122 may comprise signalling lights, track points, points heaters, level crossings, a switchgear equipment, communications networking equipment and/or monitoring equipment. The first electrical load 122 may be referred to as a first electrical equipment. It is to be appreciated that the above list of examples of the first electrical load 122 does not represent an exhaustive list. The first step-down transformer 106 is configured to step down a supply voltage from the distribution level to an operational level, which is used to power the first electrical load 122. In some railway systems, the distribution voltage is stepped down from the voltage of around 650V to an operational level voltage of approximately 110V. If a fault occurs within the first step-down transformer 106 or the first electrical load 122, the second switch 136a and the third switch 136b may be opened to separate the first step-down transformer 106 and the first electrical load 122 from the remainder of the power supply network 100. The first step-down transformer 106 and the first electrical load 122 are shown as being encased within the first SAH 114. However, in other embodiments the first step-down transformer 106 and/or the first electrical load 122 may be positioned outside of the first SAH 114.

The first electrical load 122 is connected to the first MET 128. The first MET 128 is in turn connected to the first SAH 114 and is earthed via a first earth connection 142. The first earth connection 142 of the first SAH 114 may take a form of an earth rod, an earth mat and/or a connection to an earthed structure. The earthed structure may comprise, for example, an earthed overhead line equipment. In some embodiments, the first MET 128 may not be present within the first SAH 114. Instead, the first step-down transformer 106 and/or the first electrical load 122 may be earthed via a direct connection to the first SAH 114, which is in turn earthed via the first earth connection 142.

Housed within the second SAH 116, there is provided a fourth switch 138a, a fifth switch 138b, a second step-down transformer 108, a second electrical load 124 and a second main earth terminal (MET) 130. The second step-down transformer connects the second electrical load 124 to the PSP 102 via the fourth switch 138a and the fifth switch 138b. The second electrical load 124 may comprise signalling lights, track points, points heaters, level crossings, switchgear equipment, communications networking equipment and/or monitoring equipment. It is to be appreciated that the above list of examples of the second electrical load 124 does not represent an exhaustive list. The second step-down transformer 108 is configured to step down a supply voltage from the distribution level to an operational level, which is used to power the second electrical load 124. If a fault occurs within the second step-down transformer 108 or the second electrical load 124, the fourth switch 138a and the fifth switch 138b may be opened to separate the second step-down transformer 108 and the second electrical load 124 from the remainder of the power supply network 100. The second step-down transformer 108 and the second electrical load 124 are shown as being encased within the second SAH 116. However, in other embodiments the second step-down transformer 108 and/or the second electrical load 124 may be positioned outside of the second SAH 116.

The second electrical load 124 is connected to the second MET 130. The second MET 130 is in turn connected to the second SAH 116 and is earthed via a second earth connection 144. The second earth connection 144 of the second SAH 116 may take a form of an earth rod, an earth mat and/or a connection to an earthed structure. The earthed structure may comprise, for example, an earthed overhead line equipment. In some embodiments, the second MET 130 may not be present within the second SAH 116. Instead, the second step-down transformer 108 and/or the second electrical load 124 may be earthed via a direct connection to the second SAH 116, which is in turn earthed via the second earth connection 144.

Housed within the third SAH 120, there is provided a sixth switch 140a, a seventh switch 140b, a third step-down transformer 110, a third electrical load 126 and a third main earth terminal (MET) 132. The third step-down transformer connects the third electrical load 126 to the PSP 102 via the sixth switch 140a and the seventh switch 140b. The third electrical load 126 may comprise signalling lights, track points, points heaters, level crossings, switchgear equipment, communications networking equipment and/or monitoring equipment. It is to be appreciated that the above list of examples of the third electrical load 126 does not represent an exhaustive list. The third step-down transformer 110 is configured to step down a supply voltage from the distribution level to an operational level, which is used to power the third electrical load 126. If a fault occurs within the third step-down transformer 110 or the third electrical load 126, the sixth switch 140a and the seventh switch 140b may be opened to separate the third step-down transformer 110 and the third electrical load 126 from the remainder of the power supply network 100. The third step-down transformer 110 and the third electrical load 126 are shown as being encased within the third SAH 120. However, in other embodiments the third step-down transformer 110 and/or the third electrical load 126 may be positioned outside of the third SAH 120.

The third electrical load 126 is connected to the third MET 132. The third MET 132 is in turn connected to the third SAH 120 and is earthed via a third earth connection 146. The third earth connection 146 of the third SAH 120 may take a form of an earth rod, an earth mat and/or a connection to an earthed structure. The earthed structure may comprise, for example, an earthed overhead line equipment. In some embodiments, the third MET 132 may not be present within the third SAH 120. Instead, the third step-down transformer 110 and/or the third electrical load 126 may be earthed via a direct connection to the third SAH 120, which is in turn earthed via the third earth connection 146.

Figure 2:
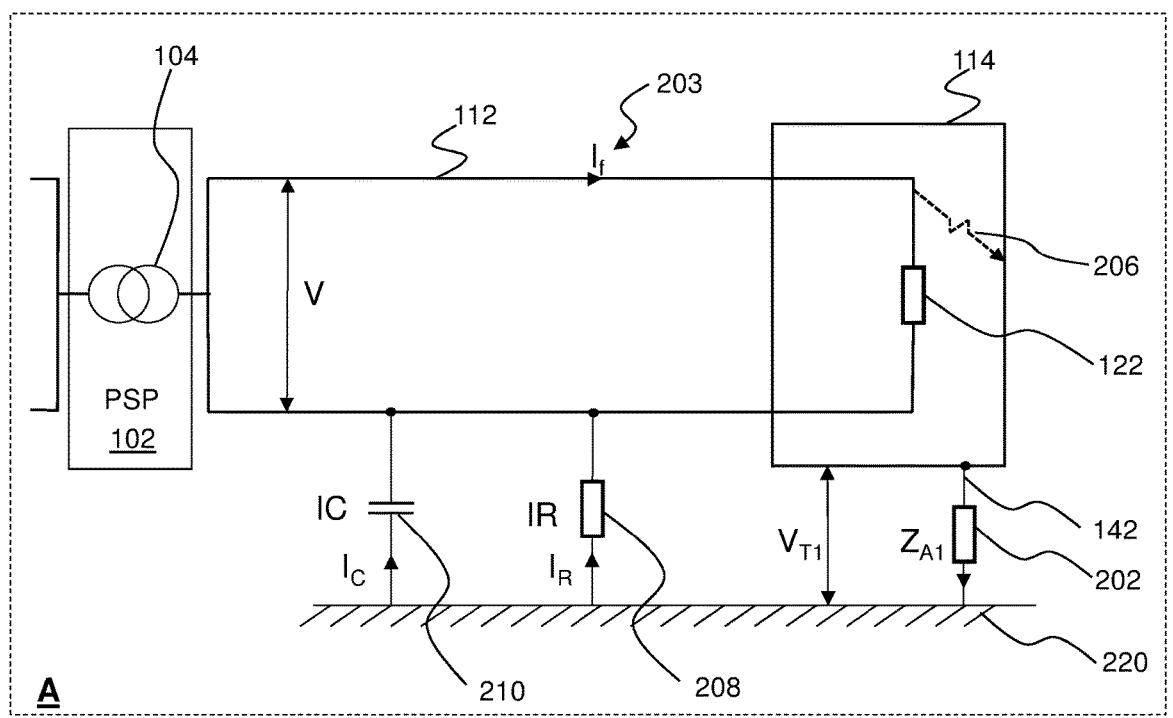
FIG. 2 shows an earth fault leakage current path within section A of FIG. 1, with some elements of the power supply network removed for clarity.

Referring to FIG. 2 there is shown a path of an earth fault leakage current within section A of FIG. 1. The first MET 128, the first switch 134, the second switch 136a, the third switch 136b and the first step-down transformer 106 have been removed from the schematic representation of this part of the power supply network 100 for the sake of clarity.

The PSP 102 supplies a distribution voltage V to the first electrical load 122 encased within the first SAH 114. A total earth fault leakage current 203 flowing through the first electrical load 122 is shown by a symbol $I_f$. An insulation resistance 208 and an insulation capacitance 210 of the power supply network 100 are represented by a resistor IR and a capacitor IC, respectively. The insulation resistance 208 can be defined as a total resistance between any two points separated by electrical insulation. The insulation capacitance 210 can be defined as a total capacitance between any two points separated by electrical insulation. The insulation capacitance 210 has an associated capacitive earth fault leakage current $I_C$ and the insulation resistance 208 has an associated resistive earth fault leakage current $I_R$. The first SAH 114 is connected to an earth plane 220 via the first earth connection 142. An impedance 202 of the first earth connection 142 is shown as impedance $Z_{A1}$. In some instances, a fault path 206 may develop between electrical components encased within the first SAH 114 and an outer case of the first SAH 114. A touch voltage $V_{T1}$ between the first SAH 114 and the earth plane 220 may be present due to the developed fault path 206. The touch voltage $V_{T1}$ can be defined as voltage between an exposed surface of an energized object and the feet of a person in contact with the object.

Upon installation, and throughout operation, the impedance 202 of the first earth connection 142 should ideally be zero ohms (0Ω). This way, if a fault path 206 develops within the first SAH 114, the total earth fault leakage current 203 will be directed to the earth plane 220 and a dangerous touch voltage $V_{T1}$ will not be present on the outer case of the first SAH 114. However, it may not be practicable to achieve a 0Ω impedance of the first earth connection 142 due to imperfections in the earthing arrangement and/or any imperfections in the connection between the earthing arrangement and the earth itself. Therefore, most power supply networks specify a maximum tolerable impedance $Z_{A-max}$ of the first earth connection. The maximum tolerable impedance $Z_{A-max}$ can be defined as a threshold above which the first earth connection 142 no longer affords protection against the dangerous touch voltage $V_{T1}$ that may have developed due to the fault path 206. For example, in some power supply networks 100, the maximum tolerable impedance $Z_{A-max}$ is defined as 10Ω. If the impedance 202 of the first earth connection 142 is above the maximum tolerable impedance $Z_{A-max}$ a dangerous touch voltage $V_{T1}$ may be present on the outer case of the first SAH 114. A dangerous touch voltage may be defined as a voltage above 50V, or any other voltage that presents a risk of electric shock.

Over time, the first earth connection 142 may degrade and the impedance 202 of the first earth connection 142 may increase towards the maximum tolerable impedance $Z_{A-max}$ To ensure that a dangerous touch voltage $V_{T1}$ does not develop on the outer casing of the first SAH 114, the impedance 202 of the first earth connection 142 should be monitored periodically. Current techniques require a user to conduct periodic manual inspection of the impedance 202 of the first earth connection 142. Such manual inspection is often time-consuming and may pose safety risks to the user. In some power supply network installations, the first earth connection 142 of the first SAH 114 may be difficult or indeed impossible to access. For example, the first SAH 114 may be positioned in a remote location. Therefore, a method that allows for remote determination of the impedance 202 of the first earth connection 142 is highly desirable. A method of remotely determining an impedance of an earth connection of a first electrical equipment, in accordance with the present disclosure, is described below with reference to FIG. 6.

Although FIG. 2 only shows the impedance 202 of the first earth connection 142 for the sake of simplicity, an impedance of the second earth connection 144 and the third earth connection 146 (shown in FIG. 1), can be defined in a similar manner. Uke the impedance 202 of the first earth connection 142, the impedance of the second earth connection 144 and the third earth connection 146 may also require periodic inspection to ensure safety of the power supply network 100.

Figure 3:
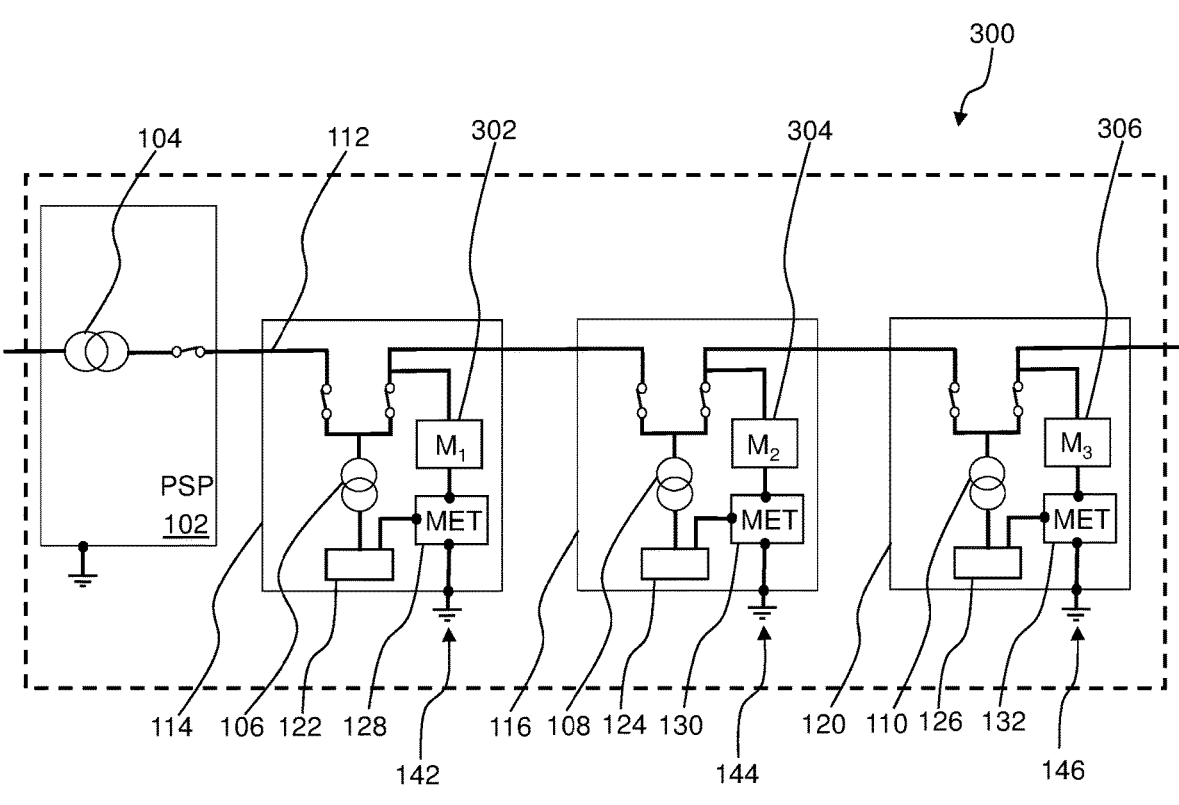
FIG. 3 shows a schematic representation of a monitoring arrangement for a part of a power supply network.

FIG. 3 shows a schematic representation of a monitoring arrangement 300 for a part of a power supply network 100. The monitoring arrangement 300 shows the part of the power supply network 100 further including a first measurement node 302, a second measurement node 304 and a third measurement node 306. For the sake of conciseness, the functionality of elements of the power supply network 100 that have already been described with reference to FIG. 1 will not be repeated. A more detailed description of the monitoring arrangement 300 can be found in the Applicant's earlier patent, GB2552143B, which is hereby incorporated by reference in its entirety.

The first measurement node 302 may take a form of any monitoring apparatus capable of measuring at least the insulation resistance 208 and an insulation capacitance 210 of the power supply network 100. The insulation resistance measured by the first measurement node 302 is hereinafter referred to as $IR_1$ and the insulation capacitance measured by the first measurement node 302 is hereinafter referred to as $IC_1$. The first measurement node may also be capable of measuring an insulation inductance (not shown) of the power supply network 100. The first measurement node 302 is located within the first SAH 114 and is connected to the PSP 102 via the elongated cable 112. The first measurement node 302 is also connected in series with the first earth connection 142 of the first SAH 114 via the first MET 128. In this particular configuration, the first measurement node 302 shares the first earth connection 142 with the first electrical load 122. The first measurement node 302 may contain one or more relays (not shown). The one or more relays within the first measurement node 302 may be switchable to disconnect the first measurement node 302 from the PSP 102, thereby isolating the first measurement node 302 from the power supply network 100.

The second measurement node 304 may take a form of any monitoring apparatus capable of measuring at least the insulation resistance 208 and the insulation capacitance 210 of the power supply network 100. The insulation resistance measured by the second measurement node 304 is hereinafter referred to as $IR_2$ and the insulation capacitance measured by the second measurement node 304 is hereinafter referred to as $IC_2$. The second measurement node may also be capable of measuring an insulation inductance (not shown) of the power supply network 100. The second measurement node 304 is located within the second SAH 116 and is connected to the PSP 102 via the elongated cable 112. The second measurement node 304 is also connected in series with the second earth connection 144 of the second SAH 116 via the second MET 130. In this particular configuration, the second measurement node 304 shares the second earth connection 144 with the second electrical load 124. The second measurement node 304 may contain one or more relays (not shown). The one or more relays within the second measurement node 304 may be switchable to disconnect the second measurement node 304 from the PSP 102, thereby isolating the second measurement node 304 from the power supply network 100.

The third measurement node 306 may take a form of any monitoring apparatus capable of measuring at least the insulation resistance 208 and the insulation capacitance 210 of the power supply network 100. The insulation resistance measured by the third measurement node 306 is hereinafter referred to as $IR_3$ and the insulation capacitance measured by the third measurement node 306 is hereinafter referred to as $IC_3$. The third measurement node may also be capable of measuring an insulation inductance (not shown) of the power supply network 100. The third measurement node 306 is located within the third SAH 120 and is connected to the PSP 102 via the elongated cable 112. The third measurement node 306 is also connected in series with the third earth connection 146 of the third SAH 120 via the third MET 132. In this particular configuration, the third measurement node 306 shares the third earth connection 146 with the third electrical load 126. The third measurement node 306 may contain one or more relays (not shown). The one or more relays within the third measurement node 306 may be switchable to disconnect the third measurement node 306 from the PSP 102, thereby isolating the third measurement node 306 from the power supply network 100.

Although the monitoring arrangement 300 shows the first measurement node 302, the second measurement node 304 and the third measurement node 306 as being located within the first SAH 114, the second SAH 116 and the third SAH 120 respectively, other arrangements of the measurement nodes are possible. In some embodiments, more than three measurement nodes are present within the monitoring arrangement 300. For example, an additional measurement node may be connected to the PSP 102. Further, in some embodiments one or more of the measurement nodes may be located outside of a SAH. For example, the second measurement node 304 may be positioned in a standalone housing, outside of the second SAH 116. In this particular example, the second measurement node may have a separate earth connection and may not share the second earth connection 144 with other electrical equipment like the second electrical load 124.

Figure 4:
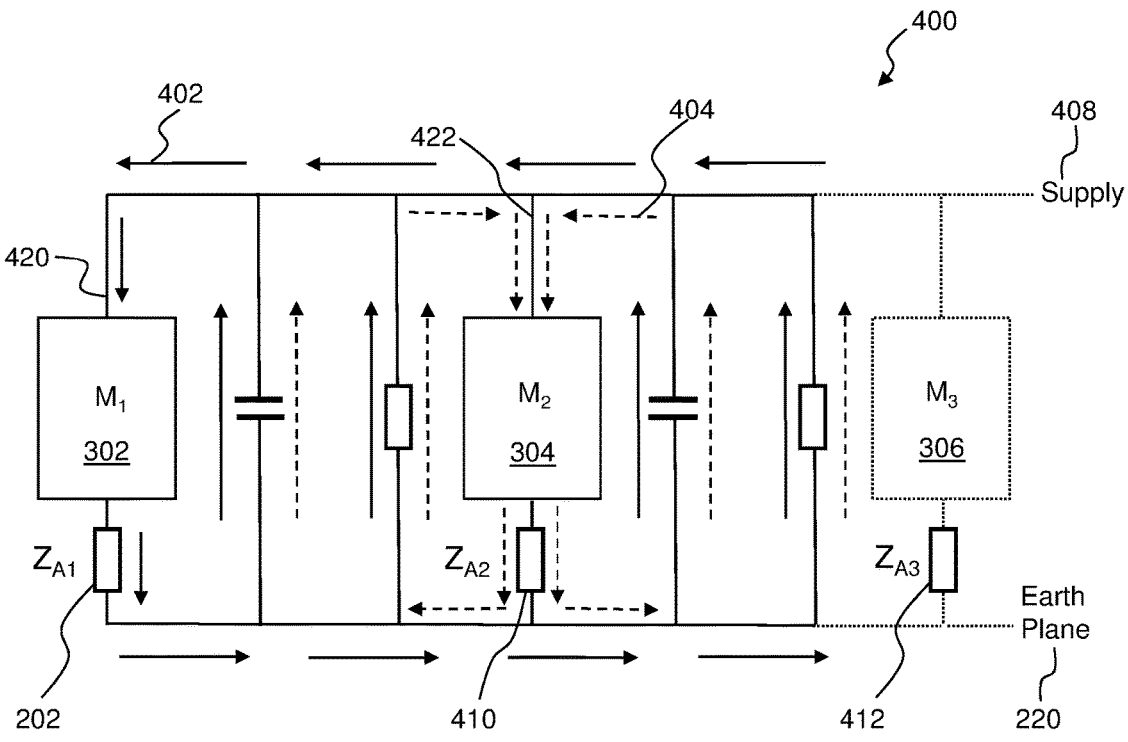
FIG. 4 shows a schematic representation of a current flow within the monitoring arrangement in FIG. 3.

Referring to FIG. 4 there is shown a schematic representation of a current flow within the monitoring arrangement of FIG. 3.

The impedance value 202 of the first earth connection 142 of the first measurement node 302 is represented by impedance $Z_{A1}$. An impedance value 410 of the second earth connection 144 of the second measurement node 304 is represented by impedance $Z_{A2}$. An impedance value 412 of the third earth connection 146 of the third measurement node 306 is represented by impedance $Z_{A3}$.

In the schematic representation, the solid arrows represent a first path 402 of the current flow from the first measurement node 302. The dashed arrows represent a second path 404 of the current flow from the second measurement node 304. A path of the current flow from the third measurement node 306 is not shown in the schematic representation for the sake of clarity. The first path 402 of the current flow and the second path 404 of the current flow occur between an electrical supply line 408 and the earth plane 220. The electrical supply line 408 can be considered as the elongated cable 112 that carries an electrical current to the respective measurement nodes.

If a first path 402 of the current flow was identical to a second path 404 of the current flow, then both the first measurement node 302 and the second measurement node 304 would record identical values of the insulation resistance 208 and the insulation capacitance 210 of the power supply network 100.

However, a path 420 connecting the first measurement node 302 between the electrical supply line 408 and the earth plane 220 is unique to the first measurement node 302. As such, a value of insulation resistance $IR_1$ and a value of insulation capacitance $IC_1$ measured by the first measurement node 302 is affected by the impedance value $Z_{A1}$ 202 of the first earth connection 142 of the first measurement node 302. A path 422 connecting the second measurement node 304 between the electrical supply line 408 and the earth plane 220 is unique to the second measurement node. As such, a value of the insulation resistance $IR_2$ and a value of the insulation capacitance $IC_2$ measured by the second measurement node 304 is affected by the impedance value $Z_{A2}$ 410 of the second earth connection 144 of the second measurement node 304. Therefore, any differences in the values of insulation resistance and the values of insulation capacitance measured by the first and the second measurement nodes are attributable to the impedance of their respective earth connections. This phenomenon may be used to remotely determine an impedance of an earth connection of a given measurement node, as explained below with reference to FIG. 6.

Figure 5:
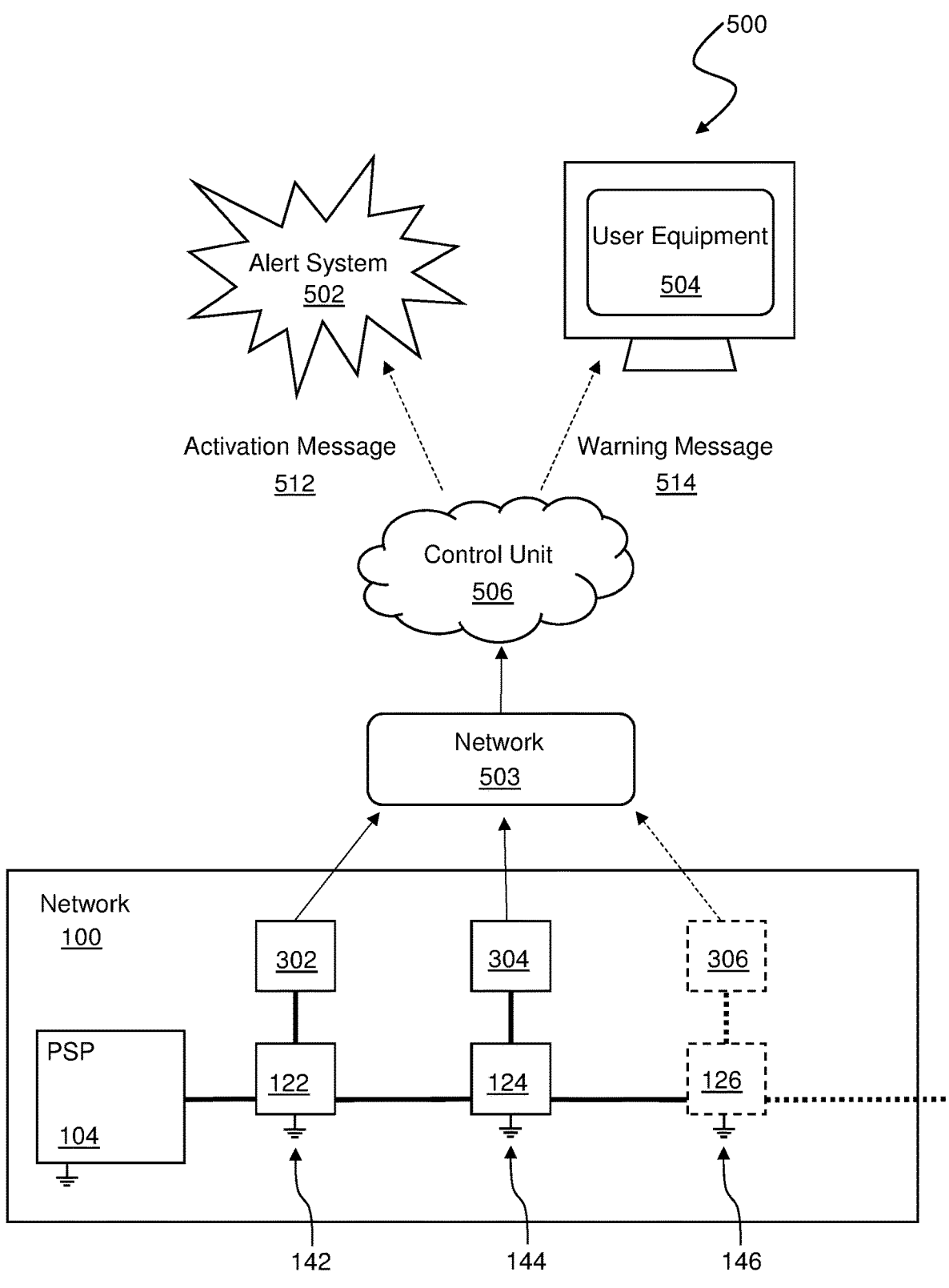
FIG. 5 is a schematic representation of a system suitable for implementing the present disclosure.

FIG. 5 is a schematic representation of a system 500 suitable for implementing a method of determining an impedance of an earth connection 142 of a first electrical equipment connected to a power supply network 100, in accordance with the present disclosure. The system 500 includes the power supply network 100 that has been previously described with reference to FIGS. 1-4, and a control unit 506. In some implementations, the system may further comprise an alert system 502 and/or a user equipment 504.

The control unit 506 may take a form of any computing device capable of receiving and processing data. The control unit may comprise a processor, a memory and a communication interface (not shown). In one example, the control unit 506 comprises a cloud-based analytics engine. The alert system 502 may comprise a visual, auditory, and/or a haptic output. In one example, the alert system may comprise a warning light. In another example, the alert system may comprise an auditory alarm. In some embodiments, the system 500 may comprise a plurality of alert systems 502, each positioned proximally to the first earth connection 142, the second earth connection 144 or the third earth connection 146. In this manner, if a fault develops in the first earth connection 142, the second earth connection 144 or the third earth connection 146, an alert system 502 proximal to the faulty earth connection may be activated. Although the user equipment 504 is depicted as a computer, the user equipment 504 may comprise any type of a user device, such as a smartphone, tablet computer, laptop computer, desktop computer, smart television, or a wearable device (e.g., a smartwatch).

The first measurement node 302, the second measurement node 304 and the third measurement node 306 are configured to communicate with the control unit 506 using a communication network 503. The communication network

503 may comprise a wired network, an optical fibre based communications network and/or a wireless communications network.

In some embodiments, the control unit 506 may send an activation message 512 to activate the alert system 502. Additionally or alternatively, the control unit may send a warning message 514 to the user equipment 504. The activation message 512 may be capable of activating the alert system 502. The warning message 514 may comprise a warning indicating that a fault has developed in an earth connection of an electrical equipment within the power supply network 100. Additionally, the warning message 514 may comprise an indication of a location of the faulty electrical equipment. The activation message 512 and the warning message 514 may be transmitted using a wired network, an optical fibre based communications network and/or a wireless communications network.

Figure 6:
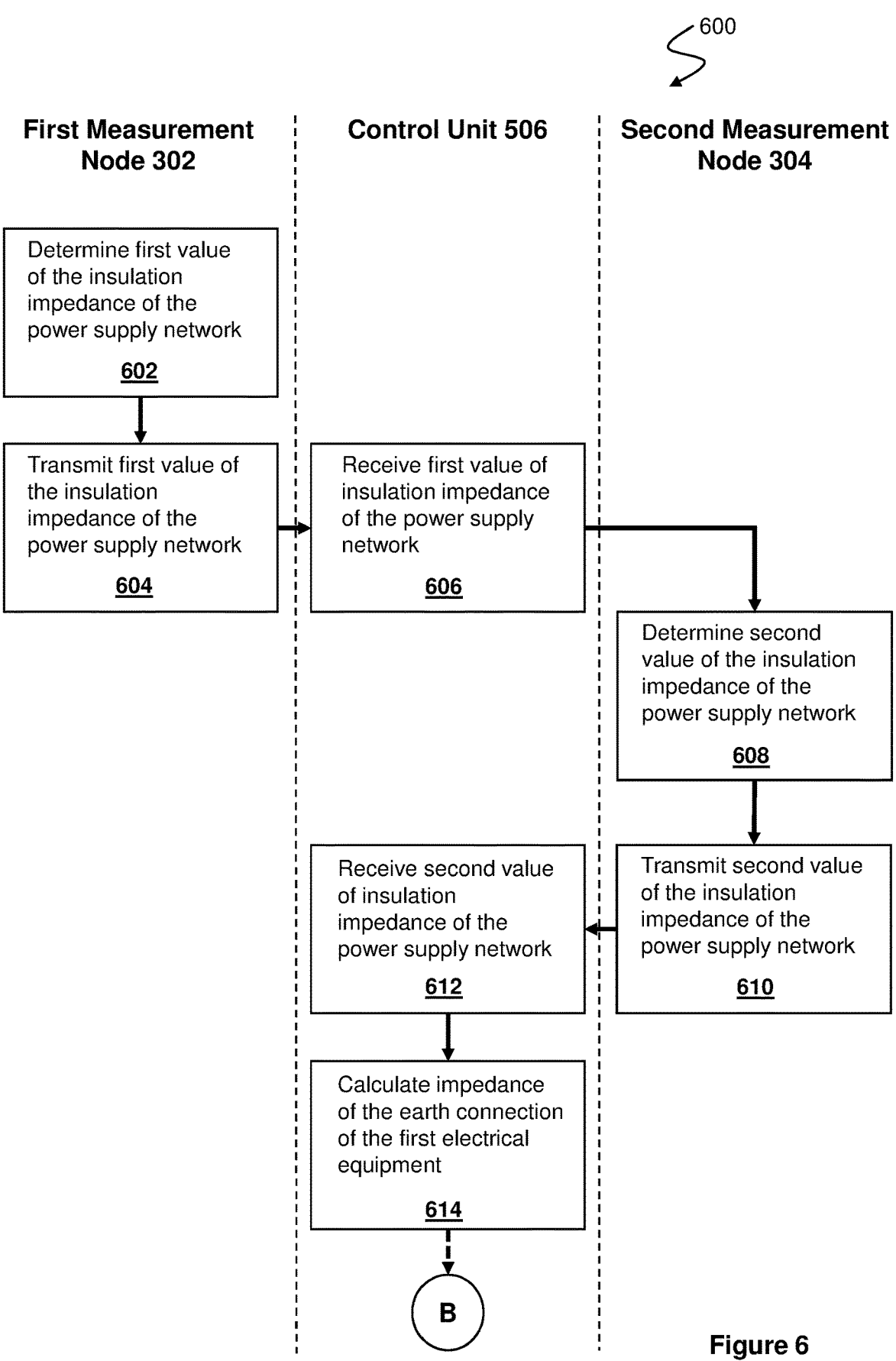
FIG. 6 is a flow diagram of a method of remotely determining an impedance of an earth connection of a first electrical equipment, in accordance with the present disclosure.

FIG. 6 is a flow diagram of an example method 600 of remotely determining the impedance $Z_{A1}$ of the earth connection 142 of the first electrical equipment 122. The method 600 is especially advantageous as it removes the need for conducting manual and intrusive testing to determine the impedance $Z_{A1}$ of the earth connection 142 of the first electrical equipment 122.

The method 600 begins at block 602, in which the first measurement node 302 determines a first value of insulation impedance of the power supply network 100. The method for determining the first value of insulation impedance of the power supply network 100 is described in more detail with reference to FIG. 7. The first value of insulation impedance of the power supply network 100 can be expressed in a complex form as:

$$Z_1 = (Z_{R1} + Z_{A1}) + Z_{C1}j \qquad \text{Equation 1}$$

$Z_1$ represents the first value of insulation impedance determined by the first measurement node 302. $Z_{R1}$ represents a first value of resistive impedance of the power supply network 100. $Z_{A1}$ is the impedance value 202 of the first earth connection 142. As shown in FIG. 3, the first measurement node 302 and the first electrical equipment 122 share the first earth connection 142. In combination, $Z_{R1}$ and $Z_{A1}$ define a resistive component of the first value of the insulation impedance $Z_1$ of the power supply network 100. $Z_{C1}$ represents a first value of capacitive impedance of the power supply network 100. More generally, $Z_{C1}$ is a reactive component of the first value of the insulation impedance $Z_1$ of the power supply network 100.

The first value of resistive impedance $Z_{R1}$ of the power supply network 100 is equivalent to the insulation resistance $IR_1$ measured by the first measurement node 302. The first value of capacitive impedance $Z_{C1}$ of the power supply network 100 is related to the insulation capacitance $IC_1$ measured by the first measurement node 302 using the following equation:

$$Z_{C1} = \frac{1}{2\pi f I C_1} \qquad \text{Equation 2}$$

where $Z_{C1}$ is the first value of capacitive impedance of the power supply network 100, f is a frequency of AC current passing through the power supply network 100 and $IC_1$ is the insulation capacitance measured by the first measurement node 302.

At block 604, the first measurement node 302 transmits the first value of the insulation impedance $Z_1$ to the control unit 506. Then, at block 606 the control unit 506 receives the first value of the insulation impedance $Z_1$. The first measurement node 302 may transmit the first value of the insulation impedance $Z_1$ using a wired network, an optical fibre based communications network and/or a wireless communications network.

At block 608 the second measurement node 304 determines a second value of insulation impedance of the power supply network 100. The method for determining the second value of insulation impedance of the power supply network 100 is described in more detail with reference to FIG. 8. The second value of insulation impedance of the power supply network 100 can be expressed in a complex form as:

$$Z_2 = (Z_{R2} + Z_{A2}) + Z_{C2}j \qquad \text{Equation 3}$$

$Z_2$ represents the second value of insulation impedance determined by the second measurement node 304. $Z_{R2}$ represents a second value of resistive impedance of the power supply network 100. $Z_{A2}$ is the impedance value 410 of the second earth connection 144. As shown in FIG. 3, the second measurement node 304 and the second electrical equipment 124 share the second earth connection 144. $Z_{A2}$ is a known impedance value. For example, $Z_{A2}$ may have been previously obtained through manual measurement. In combination, $Z_{R2}$ and $Z_{A2}$ define a resistive component of the second value of the insulation impedance $Z_2$ of the power supply network 100. $Z_{C2}$ represents a second value of capacitive impedance of the power supply network 100. More generally, $Z_{C2}$ is a reactive component of the second value of the insulation impedance $Z_2$ of the power supply network 100.

The second value of resistive impedance $Z_{R2}$ of the power supply network 100 is equivalent to the insulation resistance $IR_2$ measured by the second measurement node 304. The second value of capacitive impedance $Z_{C2}$ of the power supply network 100 is related to the insulation capacitance $IC_2$ measured by the second measurement node 304 using the following equation:

$$Z_{C2} = \frac{1}{2\pi f IC_2} \qquad \text{Equation 4}$$

Where $Z_{C2}$ is the second value of capacitive impedance of the power supply network 100, f is a frequency of AC current passing through the power supply network 100 and $IC_2$ is the insulation capacitance measured by the second measurement node 304.

At block 610, the second measurement node 304 transmits the second value of the insulation impedance $Z_2$ to the control unit 506. Then, at block 612 the control unit 506 receives the second value of the insulation impedance $Z_2$. The second measurement node 304 may transmit the second value of the insulation impedance $Z_2$ using a wired network, an optical fibre based communications network and/or a wireless communications network.

At block 614, the control unit 506 calculates the impedance $Z_{A1}$ of the earth connection 142 of the first electrical equipment 122. The impedance $Z_{A1}$ of the earth connection 142 of the first electrical equipment 122 is calculated using the first value of the insulation impedance $Z_1$ of the power supply network 100, the second value of the insulation impedance $Z_2$ of the power supply network 100 and a known impedance value $Z_{A2}$ of the earth connection 144 of the second measurement node 304.

The method of calculating the impedance $Z_{A1}$ of the earth connection 142 of the first electrical equipment 122 will now be described in more detail. As discussed with reference to FIG. 4, any differences in the values of insulation resistance $IR_1$, $IR_2$ and the values of insulation capacitance $IC_1$, $IC_2$ measured by the first and the second measurement nodes 302, 304 are attributable to the impedance $Z_{A1}$, $Z_{A2}$ of their respective earth connections 142, 144. Therefore, the first value of insulation impedance $Z_1$ determined by the first measurement node 302 should be equal to the second value of insulation impedance $Z_2$ determined by the second measurement node 304. By solving equations 1 and 3 simultaneously, it can be shown that:

$$Z_{A1} = (Z_{R2} - Z_{R1} + Z_{A2}) + (Z_{C2} - Z_{C1})j \qquad \text{Equation 5}$$

In this manner, the impedance $Z_{A1}$ of the earth connection 142 of the first electrical equipment 122 can be determined remotely.

Although blocks 608, 610 and 612 are shown in FIG. 6 as occurring after blocks 602, 604 and 606, it is possible for some or all of the operations performed at blocks 608, 610 and 612 to occur before, or at substantially the same time as, the operations performed at blocks 602, 604 and 606. In particular, it is not necessary for the control unit 506 to receive the first value of insulation impedance at 606 before the second measure node 304 determines the second value of the insulation impedance of the power supply network.

FIG. 7 is a flow diagram of a method 700 of determining the first value of the insulation impedance $Z_1$ of the power supply network 100 by the first measurement node 302. Before performing the method 700, the first measurement node 302 may connect to the power supply network 100.

The method 700 begins at block 702, in which the first measurement node 302 measures the first value of insulation resistance $IR_1$ of the power supply network 100.

At block 704, the first measurement node 302 measures the first value of insulation capacitance $IC_1$ of the power supply network 100.

At block 706, the first measurement node 302 calculates the first value of insulation impedance $Z_1$ of the power supply network 100. To calculate the first value of insulation impedance $Z_1$ of the power supply network, the first measurement node 302 firstly determines the first value of resistive impedance $Z_{R1}$ and the first value of capacitive impedance $Z_{C1}$ using the first value of insulation resistance $IR_1$ and the first value of insulation capacitance $IC_1$ respectively. Subsequently, the first value of resistive impedance $Z_{R1}$ and the first value of capacitive impedance $Z_{C1}$ are used within equation 1 to determine the first value of insulation impedance $Z_1$.

At block 708, the first measurement node 302 disconnects from the power supply network 100. Although operation 708 is shown as being executed after operation 706, it is possible for the first measurement node 302 to perform operation 708 prior to the operation 706. Further, while operation 706 is shown as being executed by the first measurement node 302, it is possible for this operation to be instead executed by the control unit 506. In such a scenario, the first measurement node 302 may send the first value of insulation resistance $IR_1$ and the first value of insulation capacitance $IC_1$ to the control unit 506, and the control unit 506 may calculate the first value of insulation impedance $Z_1$.

FIG. 8 is a flow diagram of a method 800 of determining the second value of the insulation impedance $Z_2$ of the power supply network 100 by the second measurement node 304. Before performing the method 800, the second measurement node 304 may connect to the power supply network 100.

The method 800 begins at block 802, in which the second measurement node 304 measures the second value of insulation resistance $IR_2$ of the power supply network 100.

At block 804, the second measurement node 304 measures the second value of insulation capacitance $IC_2$ of the power supply network 100.

At block 806, the second measurement node 304 calculates the second value of insulation impedance $Z_2$ of the power supply network 100. To calculate the second value of insulation impedance $Z_2$ of the power supply network, the second measurement node 304 firstly determines the second value of resistive impedance $Z_{R2}$ and the second value of capacitive impedance $Z_{C2}$ using the second value of insulation resistance $IR_2$ and the second value of insulation capacitance $IC_2$, respectively. Subsequently, the second value of resistive impedance $Z_{R2}$ and the second value of capacitive impedance $Z_{C2}$ are used within equation 3 to determine the second value of insulation impedance $Z_2$.

At block 808, the second measurement node 304 disconnects from the power supply network 100. Although operation 808 is shown as being executed after operation 806, it is possible for the second measurement node 304 to perform operation 808 prior to the operation 806. Further, while operation 806 is shown as being executed by the second measurement node 304, it is possible for this operation to be instead executed by the control unit 506. In such a scenario, the second measurement node 304 may send the second value of insulation resistance $IR_2$ and the second value of insulation capacitance $IC_2$ to the control unit 506, and the control unit 506 may calculate the second value of insulation impedance $Z_2$.

Figure 9:
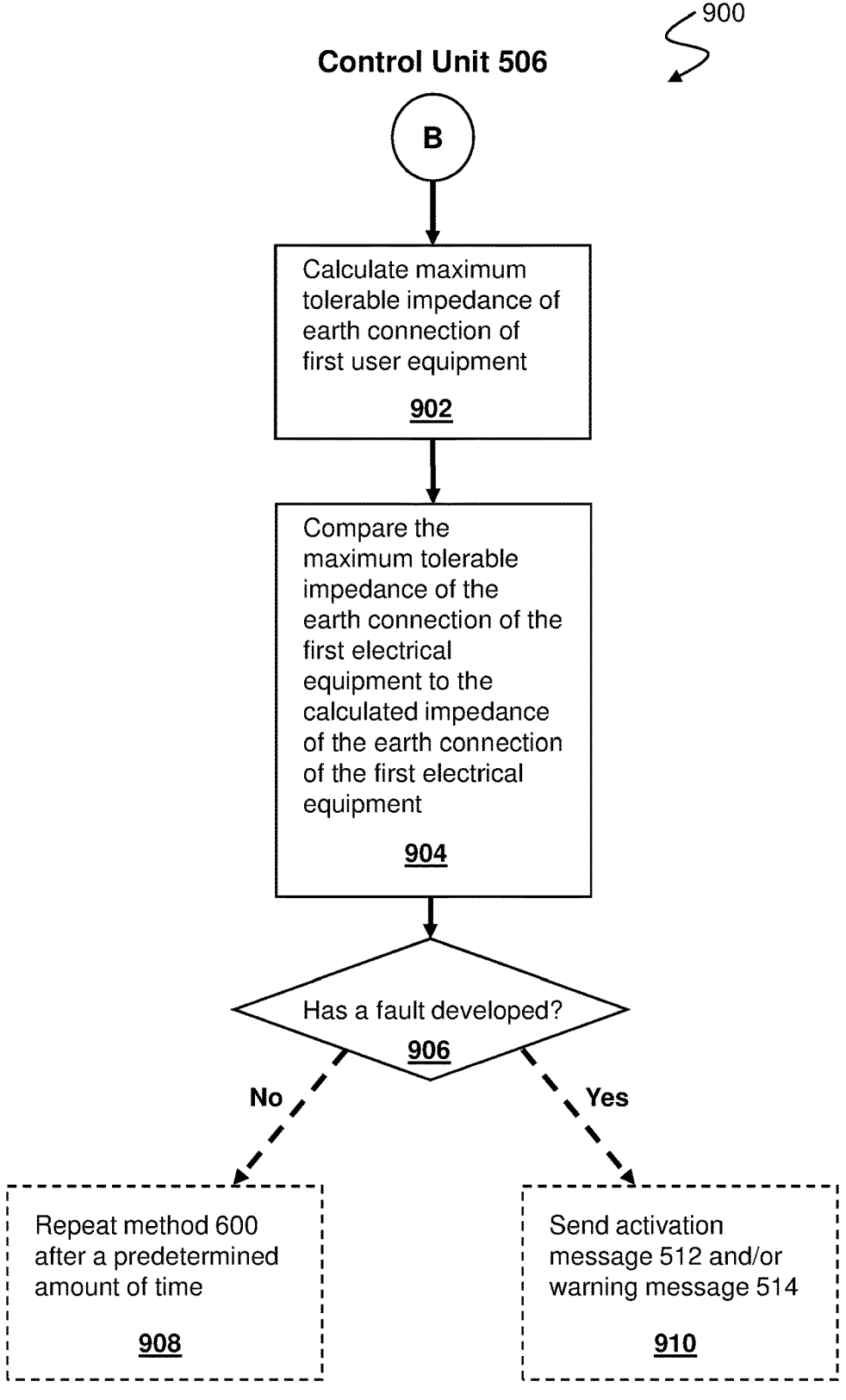
FIG. 9 is a flow diagram of a method of determining whether a fault has developed in the earth connection of the first electrical equipment.

FIG. 9 is a flow diagram of a method 900 of determining whether a fault has developed in the earth connection 142 of the first electrical equipment 122. The method 900 may be a continuation of the method 600 shown in FIG. 6.

The method begins at block 902, where the control unit 506 calculates a maximum tolerable impedance $Z_{A\text{-}max}$ of the earth connection 142 of the first user equipment 122. In an alternative implementation of the method (not shown), the maximum tolerable impedance $Z_{A\text{-}max}$ of the earth connection 142 of the first user equipment 122 may be calculated manually and input into the control unit 506. The maximum tolerable impedance $Z_{A\text{-}max}$ can be defined as a threshold above which the first earth connection 142 no longer affords protection against the dangerous touch voltage $V_{T1}$ that may have developed due to the fault path 206 (shown in FIG. 2). For example, in some power supply networks 100, the maximum tolerable impedance $Z_{A\text{-}max}$ is defined as $10\Omega$.

At block 904, the control unit 506 compares the maximum tolerable impedance $Z_{A\text{-}max}$ of the earth connection 142 of the first electrical equipment 122 to the impedance $Z_{A1}$ of the earth connection 142 of the first electrical equipment 122 that has been previously calculated during operation 614 in FIG. 6.

At block 906, the control unit 506 determines if a fault developed in the earth connection 142 of the first electrical equipment 122. The control unit 506 determines that a fault has developed in the earth connection 142 of the first electrical equipment 122 if the calculated impedance value $Z_{A1}$ of the earth connection 142 of the first electrical equipment 122 exceeds the maximum tolerable impedance $Z_{A\text{-}max}$ of the earth connection 142 of the first electrical equipment 122.

If a fault has developed in the earth connection 142 of the first electrical equipment 122, the control unit 506 may transmit the activation message 512 and/or the warning message 514 at block 910 of the method 900.

If a fault has not developed in the earth connection 142 of the first electrical equipment 122, the control unit 506 may repeat the method 600 after a predetermined amount of time at block 908. In one example, the control unit 506 may track the changes to the impedance value $Z_{A1}$ of the earth connection 142 of the first electrical equipment 122 over the predetermined amount of time.

Although the methods 600, 700, 800 and 900 and apparatuses 302, 304, 306, 506 have been described in the context of a power supply network for a railway signalling system, it will be appreciated that they could be used to determine an impedance of an earth connection of any suitable type of electrical equipment in any suitable type of power supply network. Accordingly, the applicability of the present disclosure is not limited to railways. Purely by way of example, the techniques described herein could be used to determine the impedance of an earth connection of one or more machines in a factory or other production facility, or to determine the impedance of an earth connection of equipment in a road signalling system.

The methods 600, 700, 800 and/or 900 can be performed by instructions stored on a processor-readable medium. The processor-readable medium may be: a read-only memory (including a PROM, EPROM or EEPROM); random access memory; a flash memory; an electrical, electromagnetic or optical signal; a magnetic, optical or magneto-optical storage medium; one or more registers of a processor; or any other type of processor-readable medium. In alternative embodiments, the present disclosure can be implemented as control logic in hardware, firmware, software or any combination thereof. The first measurement node 302, the control unit 506 and/or the second measurement node 304 may be implemented by dedicated hardware, such as one or more application-specific integrated circuits (ASICs) or appropriately connected discrete logic gates. A suitable hardware description language can be used to implement the method described herein with dedicated hardware.

It will be understood that the invention has been described above purely by way of example, and that modifications of detail can be made within the scope of the claims. In particular, the sequence of operations shown in FIGS. 6, 7, 8 and 9 is merely an example. Any of the operations shown in methods 600, 700, 800 and/or 900 may be performed in a different order that achieves substantially the same result.

The invention claimed is:

1. A method of remotely determining an impedance of an earth connection of a first electrical equipment connected to a power supply network, the method comprising:

receiving, from a first measurement node connected to the first electrical equipment, a first value of an insulation impedance of the power supply network, wherein the first measurement node and the first electrical equipment share an earth connection;

receiving, from a second measurement node connected to the power supply network, a second value of an insulation impedance of the power supply network; and calculating, using one or more processors and a memory comprising computer readable instructions executable by the processors, the impedance of the earth connection of the first electrical equipment using the first value of the insulation impedance of the power supply network, the second value of the insulation impedance of the power supply network and a known impedance value of an earth connection of the second measurement node.

2. The method according to claim 1, wherein the first electrical equipment is within a first housing.

3. The method according to claim 2, wherein the earth connection of the first electrical equipment comprises an earth connection of the first housing.

4. The method according to claim 3, wherein the first measurement node is connected in series with the earth connection of the first housing.

5. The method according to claim 1, wherein the second measurement node is connected to a second electrical equipment and the second electrical equipment is connected to the power supply network.

6. The method according to claim 5, wherein the second electrical equipment is within a second housing,
wherein the earth connection of the second electrical equipment comprises an earth connection of the second housing, and
wherein the second measurement node is connected in series with the earth connection of the second housing.

7. The method according to claim 6, wherein:
determining the reactive component of the first value of the insulation impedance of the power supply network comprises measuring a first value of insulation capacitance of the power supply network.

8. The method according to claim 1, wherein the first measurement node determines the first value of the insulation impedance of the power supply network by:
determining a resistive component of the first value of the insulation impedance of the power supply network;
determining a reactive component of the first value of the insulation impedance of the power supply network; and
calculating the first value of the insulation impedance of the power supply network using the resistive component and the reactive component of the first value of the insulation impedance of the power supply network.

9. The method according to claim 8, wherein:
determining the resistive component of the first value of the insulation impedance of the power supply network comprises measuring a first value of insulation resistance of the power supply network.

10. The method according to claim 8, wherein after determining the first value of the insulation impedance of the power supply network, the first measurement node disconnects from the power supply network.

11. The method according to claim 1, wherein the second measurement node determines the second value of the insulation impedance of the power supply network by:
determining a resistive component of the second value of the insulation impedance of the power supply network;
determining a reactive component of the second value of the insulation impedance of the power supply network; and
calculating the second value of the insulation impedance of the power supply network using the resistive component and the reactive component of the second value of the insulation impedance of the power supply network.

12. The method according to claim 11, wherein after determining the second value of the insulation impedance of the power supply network, the second measurement node disconnects from the power supply network.

13. The method according to claim 1, the method further comprising:
evaluating the integrity of the earth connection of the first electrical equipment, using the calculated impedance of the earth connection of the first electrical equipment.

14. The method according to claim 13, wherein evaluating the integrity of the earth connection of the first electrical equipment comprises:
calculating a maximum tolerable impedance of the earth connection of the first electrical equipment; and
comparing the calculated impedance of the earth connection of the first electrical equipment with the maximum tolerable impedance of the earth connection of the first electrical equipment.

15. The method according to claim 14, wherein evaluating the integrity of the earth connection of the first electrical equipment further comprises detecting a fault in the earth connection of the first electrical equipment by determining that the calculated impedance value of the earth connection of the first electrical equipment exceeds the maximum tolerable impedance of the earth connection of the first electrical equipment.

16. A method according to claim 15, further comprising generating a safety warning upon detecting the fault.

17. The method according to claim 1, further comprising:
repeating the method of remotely determining the impedance value of the earth connection of the first electrical equipment after a predetermined amount of time; and
monitoring changes to the impedance value of the earth connection of the first electrical equipment over the predetermined amount of time.

18. The method according to claim 1, further comprising:
receiving, from a third measurement node connected to a third electrical equipment, a third value of an insulation impedance of the power supply network, wherein the third electrical equipment is connected to the power supply network; and
calculating an impedance of the earth connection of the third electrical equipment using the third value of the insulation impedance of the power supply network, the second value of the insulation impedance of the power supply network and the known impedance value of the earth connection of the second measurement node.

19. An apparatus configured to remotely determine an impedance of an earth connection of a first electrical equipment connected to a power supply network, the apparatus comprising a processor and a memory, the memory storing instructions that cause the processor to:
receive, from a first measurement node connected to the first electrical equipment, a first value of an insulation impedance of the power supply network, wherein the first measurement node and the first electrical equipment share an earth connection;
receive, from a second measurement node connected to the power supply network, a second value of an insulation impedance of the power supply network; and
calculate, using one or more processors and a memory comprising computer readable instructions executable by the processors, the impedance of the earth connection of the first electrical equipment using the first value of the insulation impedance of the power supply network, the second value of the insulation impedance of the power supply network and a known impedance
value of an earth connection of the second measure-
ment node.

20. A non-transitory computer-readable medium compris-
ing instructions which, when executed by a computer, cause
the computer to perform a method remotely determining an
impedance of an earth connection of a first electrical equip-
ment connected to a power supply network, the method
comprising:

receiving, from a first measurement node connected to the
first electrical equipment, a first value of an insulation
        impedance of the power supply network;

receiving, from a second measurement node connected to
        the power supply network, a second value of an insu-
        lation impedance of the power supply network; and calculating the impedance of the earth connection of the
        first electrical equipment using the first value of the
        insulation impedance of the power supply network, the
        second value of the insulation impedance of the power
        supply network and a known impedance value of an
earth connection of the second measurement node.

* * * * *